US012765346B2

(12) United States Patent
Zhang et al.

(10) Patent No.: US 12,765,346 B2
(45) Date of Patent: Oct. 13, 2026

(54) METHOD FOR MANUFACTURING A SEMICONDUCTOR DEVICE

(71) Applicant: CSMC TECHNOLOGIES FAB2 CO., LTD., Wuxi (CN)

(72) Inventors: Wenwen Zhang, Wuxi (CN); Renrui Huang, Wuxi (CN); Yongzhi Fang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 380 days.

(21) Appl. No.: 18/571,601

(22) PCT Filed: Jun. 17, 2022

(86) PCT No.: PCT/CN2022/099406
§ 371 (c)(1),
(2) Date: Dec. 18, 2023

(87) PCT Pub. No.: WO2023/035717
PCT Pub. Date: Mar. 16, 2023

(65) Prior Publication Data

US 2024/0282621 A1 Aug. 22, 2024

(30) Foreign Application Priority Data

Sep. 9, 2021 (CN) ......................... 202111057260.9

(51) Int. Cl.
*H10W 20/42* (2026.01)
*H10P 50/28* (2026.01)
*H10W 20/00* (2026.01)

(52) U.S. Cl.
CPC ......... *H10W 20/086* (2026.01); *H10P 50/283* (2026.01); *H10W 20/056* (2026.01); *H10W 20/42* (2026.01)

(58) Field of Classification Search
CPC .... H10P 50/283; H10P 50/73; H10W 20/056; H10W 20/086; H10W 20/088; H10W 20/42
See application file for complete search history.

(56) References Cited

U.S. PATENT DOCUMENTS 6,207,576 B1 * 3/2001 Wang .................. H10W 20/086 438/743
6,265,307 B1 * 7/2001 Lou ....................... H10P 14/683 438/618

(Continued)

FOREIGN PATENT DOCUMENTS

CN 1433062 A * 7/2003 .......... H10W 20/088
CN 1238892 C * 1/2006 .......... H10W 20/088

(Continued)

OTHER PUBLICATIONS

International Search Report and Written Opinion (with English translation) for corresponding Application No. PCT/CN2022/099406, dated Aug. 16, 2022, 10 pages.

(Continued)

*Primary Examiner* — Telly D Green
(74) *Attorney, Agent, or Firm* — Dority & Manning. PA

(57) ABSTRACT

A manufacturing method for a semiconductor device includes: forming an etching termination layer, a first dielectric layer, an auxiliary dielectric layer and a second dielectric layer which are successively stacked from bottom to top; by taking a photoresist layer as an etching barrier layer, patterning the second dielectric layer to obtain a first opening pattern, the bottom of the first opening being provided with a second opening pattern exposing part of the auxiliary dielectric layer; forming a first trench passing through the second dielectric layer and the auxiliary dielectric layer and extending to the first dielectric layer, and forming a second trench passing through the first dielectric layer from the (Continued)

bottom of the first trench and extending to the etching termination layer; and forming a conductive layer in the first and second trenches.

10 Claims, 11 Drawing Sheets

(56) References Cited

U.S. PATENT DOCUMENTS

| | | | | |
|---|---|---|---|---|
| 6,284,657 | B1 * | 9/2001 | Chooi | H10W 20/075 438/638 |
| 6,372,653 | B1 * | 4/2002 | Lou | H10W 20/074 438/712 |
| 6,774,032 | B1 | 8/2004 | Park | |
| 7,235,884 | B1 * | 6/2007 | McElheny | H10W 20/47 257/762 |
| 7,510,965 | B2 * | 3/2009 | Ma | H10W 20/081 438/667 |
| 11,088,020 | B2 * | 8/2021 | Yang | H10W 20/074 |
| 2002/0064941 | A1 * | 5/2002 | Chooi | H10W 20/034 438/644 |
| 2002/0076918 | A1 * | 6/2002 | Han | H10W 20/077 438/634 |
| 2002/0130417 | A1 * | 9/2002 | Yew | H10W 20/075 257/E21.579 |
| 2002/0173079 | A1 * | 11/2002 | Kaltalioglu | H10W 20/085 438/118 |
| 2004/0127016 | A1 * | 7/2004 | Hoog | H10W 20/075 257/E21.579 |
| 2004/0238961 | A1 * | 12/2004 | Cunningham | H10W 20/033 257/E21.579 |
| 2004/0251549 | A1 * | 12/2004 | Huang | H10W 20/48 257/E21.576 |
| 2005/0032355 | A1 | 2/2005 | Yeh et al. | |
| 2006/0003577 | A1 * | 1/2006 | Sone | H10W 20/076 438/638 |
| 2006/0175708 | A1 * | 8/2006 | Ueno | H10W 20/075 257/762 |
| 2006/0194426 | A1 * | 8/2006 | Yang | H10W 20/087 438/618 |
| 2006/0194430 | A1 * | 8/2006 | Beck | H10W 20/033 257/E21.582 |
| 2006/0205207 | A1 | 9/2006 | Chen et al. | |
| 2007/0015327 | A1 | 1/2007 | Su | |
| 2007/0057305 | A1 * | 3/2007 | Oates | H10B 12/033 257/E21.011 |
| 2007/0278624 | A1 * | 12/2007 | Anderson | H10P 50/73 257/E21.257 |
| 2008/0090408 | A1 * | 4/2008 | Hoster | H10W 20/085 438/638 |
| 2008/0318414 | A1 * | 12/2008 | Jeong | H10W 20/043 257/E21.577 |
| 2010/0127233 | A1 * | 5/2010 | Goux | H10N 70/881 257/3 |
| 2013/0015581 | A1 * | 1/2013 | Wann | H10W 20/033 438/653 |
| 2014/0374910 | A1 * | 12/2014 | Abe | H10W 20/42 257/751 |
| 2016/0181386 | A1 * | 6/2016 | Chi | H10D 64/62 438/585 |
| 2016/0268143 | A1 | 9/2016 | Chen et al. | |
| 2019/0237356 | A1 * | 8/2019 | Srivastava | H10W 20/46 |
| 2020/0395459 | A1 * | 12/2020 | Singh | H10D 30/0223 |

FOREIGN PATENT DOCUMENTS

| | | | | | |
|---|---|---|---|---|---|
| CN | 1961418 | A | * | 5/2007 | H10P 32/20 |
| CN | 102044488 | A | | 5/2011 | |
| CN | 103972164 | A | * | 8/2014 | H10W 20/088 |
| CN | 103839877 | B | * | 12/2016 | H10W 20/43 |
| CN | 106711082 | A | | 5/2017 | |
| CN | 110890315 | A | | 3/2020 | |
| DE | 102014115955 | A1 | | 4/2016 | |

OTHER PUBLICATIONS

Office Action received in corresponding Application No. CN 202111057260.9, dated Jun. 25, 2025, 12 pages.

* cited by examiner

METHOD FOR MANUFACTURING A SEMICONDUCTOR DEVICE

CROSS-REFERENCE TO RELATED APPLICATIONS

This application is a U.S. national phase application under 35 U.S.C. § 371 based upon international patent application No. PCT/CN2022/099406 filed on Jun. 17, 2022, which itself claims priority to Chinese Patent Application No. 202111057260.9, entitled "SEMICONDUCTOR DEVICE AND MANUFACTURING METHOD THEREFOR", filed on Sep. 9, 2021, the content of which is incorporated herein by reference in its entirety

TECHNICAL FIELD

The present disclosure belongs to the technical field of semiconductor devices manufacturing, and relates to a semiconductor device and a manufacturing method therefor.

BACKGROUND

The strategy for metal interconnection in IC manufacturing industry is undergoing a drastic change, after many years of development, copper is being used as a main chip interconnect conductor among many conductors available for IC interconnects. Since copper is difficult to etch, early researchers working on copper etching are forced to consider an alternative method for producing metal wires, wherein a dual damascene method became an agreed method for copper metallization.

From a process perspective, the dual damascene process is now divided into two main types, one is Via First, Trench Last, and the other is Trench First, Via Last. Such processes require two or more coating exposures and dry etching processes to achieve, wherein a difference between two critical dimensions (CD) leads to a formation of a pattern of trench or via, and due to the need for multiple processes such as coating exposure, the process cost is high. Moreover, multiple exposures are required on the same film layer, thus the requirement for overlay (OVL) is high, and requires advanced equipment support, that is, the performance requirement of photolithography machine is high, therefore, the photoresist cost is also high. In addition, certain steps currently exist in second coating, thus defects such as brought by unclean development often exist, when exposure developing, a sufficient window is required to solve defects, and problems such as small process window are also prominent.

Accordingly, how to provide a new method for manufacturing a semiconductor device to simplify the process and reduce production costs, has become an important technical problem to be solved by those skilled in the art.

SUMMARY

In view of the aforementioned drawbacks of the prior art, an object of the present is to provide a semiconductor device and a manufacturing method therefor to address the problems in the prior art that the formation of two connected conductive layers with different critical dimensions requires multiple photolithographic masks, coatings, exposures, and developments, resulting in a high cost and a small process window.

In order to achieve the above object and other related objects, the present disclosure provides a method for manufacturing a semiconductor device, including the following steps:

- providing a substrate, and forming an etching stop layer, a first dielectric layer, an auxiliary dielectric layer, and a second dielectric layer that are successively stacked from bottom to top on the substrate;
- patterning the second dielectric layer by using a photoresist layer as an etching blocking layer, forming a first opening pattern extending downward from an upper surface of the second dielectric layer, wherein a bottom of the first opening pattern is provided with a second opening pattern exposing a part of the auxiliary dielectric layer;
- removing the auxiliary dielectric layer based on the second opening pattern by using the photoresist layer and the remaining second dielectric layer on the bottom of the first opening pattern as an etching blocking layer, and exposing the first dielectric layer at a bottom of the second opening pattern;
- removing the first dielectric layer and the second dielectric layer based on the first opening pattern and the second opening pattern by continually using the photoresist layer as an etching blocking layer, until the auxiliary dielectric layer is exposed at the bottom of the first opening pattern;
- removing the auxiliary dielectric layer at the bottom of the first opening pattern;
- removing the first dielectric layer by continually using the photoresist layer as an etching blocking layer, forming, based on the first opening pattern, a first trench extending through the second dielectric layer and the auxiliary dielectric layer and extending to the first dielectric layer, and forming, based on the second opening pattern, a second trench extending from the bottom of the first trench through the first dielectric layer and extending to the etching stop layer; and
- removing the photoresist layer and the etching stop layer at the bottom of the second trench, and forming a conductive layer in the first trench and the second trench.

Optionally, the patterning the second dielectric layer by using the photoresist layer as the etching blocking layer, forming the first opening pattern extending downward from the upper surface of the second dielectric layer, wherein the bottom of the first opening pattern is provided with the second opening pattern exposing the part of the auxiliary dielectric layer further includes: providing a photoresist opening pattern on the photoresist layer, and forming a second opening pattern exposing the part of the auxiliary dielectric layer at the bottom of the first opening pattern by controlling an inclination of a sidewall of the photoresist opening pattern.

Optionally, the patterning the second dielectric layer by using the photoresist layer as the etching blocking layer, forming the first opening pattern extending downward from the upper surface of the second dielectric layer, wherein the bottom of the first opening pattern is provided with the second opening pattern exposing the part of the auxiliary dielectric layer further includes: preparing a photoresist opening pattern in the photoresist layer by utilizing a phase difference inherent in photolithography machine, wherein the photoresist opening pattern includes a first sidewall and a second sidewall asymmetric to the first sidewall, and an angle between the first sidewall and a bottom surface of the photoresist opening is different from an angle between the second sidewall and the bottom surface of the photoresist opening.

Optionally, the first dielectric layer includes one or more of boro-phospho-silicate glass layer, phospho-silicate glass layer, fluoro-silicate glass layer, undoped silicate glass layer, tetraethyl orthosilicate layer, thermally oxidized silicon dioxide layer, and wet oxidized silicon dioxide layer; a material of the auxiliary dielectric layer includes silicon carbide; the second dielectric layer includes one or more of boro-phospho-silicate glass layer, phospho-silicate glass layer, fluoro-silicate glass layer, undoped silicate glass layer, tetraethyl orthosilicate layer, thermally oxidized silicon dioxide layer, and wet oxidized silicon dioxide layer; and a material of the etching stop layer includes one of silicon nitride and silicon oxynitride.

Optionally, the removing the auxiliary dielectric layer based on the second opening pattern by using the photoresist layer and the remaining second dielectric layer on the bottom of the first opening pattern as the etching blocking layer, and exposing the first dielectric layer at the bottom of the second opening pattern further includes: removing the auxiliary dielectric layer by dry etching, wherein an etching rate of an employed dry etching gas to the auxiliary dielectric layer is greater than an etching rate of the dry etching gas to the second dielectric layer, and when the auxiliary dielectric layer exposed by the second opening pattern is completely dry etched, there is still a remaining second dielectric layer at the bottom of the first opening pattern.

Optionally, the dry etching gas includes at least $SF_6$ and $O_2$.

Optionally, the removing the first dielectric layer and the second dielectric layer based on the first opening pattern and the second opening pattern by continually using the photoresist layer as the etching blocking layer, until the auxiliary dielectric layer is exposed at the bottom of the first opening pattern further includes: removing the first dielectric layer and the second dielectric layer by dry etching, wherein an etching rate of an employed dry etching gas to the first dielectric layer and the second dielectric layer is greater than an etching rate of the dry etching gas to the auxiliary dielectric layer, and a removal thickness of the first dielectric layer based on the second opening pattern is less than a thickness of the first dielectric layer.

Optionally, the dry etching gas includes one or more of gas combination of $CF_4/CHF_3/Ar$, $CF_4/CHF_3/Ar/O_2$, $C_4F_8/O_2/Ar$, $C_4F_8/O_2/CO/Ar$, $C_4F_6/O_2/Ar$, $C_4F_6/O_2/CO/Ar$, $C_5F_8/O_2/Ar$ and $C_5F_8/O_2/CO/Ar$.

The present disclosure also provides a semiconductor device manufactured using any one of the aforementioned methods for manufacturing the conductor device, the semiconductor device includes a dielectric layer, and a first trench and a second trench located in the dielectric layer, wherein the first trench extends downward from an upper surface of the dielectric layer, and a trench depth of the first trench is less than a thickness of the dielectric layer, wherein the second trench extends downward from a bottom surface of the first trench and extends through the dielectric layer, and the first trench and the second trench are provided with a conductive layer therein.

Optionally, the second trench is located at an edge of a bottom of the first trench.

Optionally, a material of the conductive layer includes at least one of Cu, W, Al, Ag and Au, and the conductive layer serves as a conductive interconnection layer.

Optionally, a trench depth of the first trench is greater than a trench depth of the second trench.

As described above, the semiconductor device of the present disclosure and the manufacturing method therefor form an asymmetric photoresist opening morphology by utilizing the phase difference inherent in photolithography machine, and etch a stepped opening with asymmetric left and right depths in the dielectric layer combined with subsequent preset etching menu. Based on the depth difference between left and right, and through reasonable matching of a dielectric film layer, the present disclosure achieves a manufacturing of a damascene-like damascene structure by only one coating development, which not only simplifies the process flow, but also reduces the production cost. The support of expensive lithography apparatus is not required, and the apparatus cost is lower. The present disclosure has wide applicability and can be compatible with current CMOS/DMOS/BCD processes, and has a broader application prospect.

| List of reference numbers | |
|---|---|
| S1-S7 | Step |
| 1 | Substrate |
| 2 | Etching stop layer |
| 3 | First dielectric layer |
| 4 | Auxiliary dielectric layer |
| 5 | Second dielectric layer |
| 6, 6', 6", 6"' | Photoresist layer |
| 7 | Photoresist opening pattern |
| 701 | First sidewall |
| 702 | Second sidewall |
| 801 | First opening pattern |
| 802 | Second opening pattern |
| 901 | First trench |
| 902 | Second trench |
| 10 | Conductive layer |

DETAILED DESCRIPTION OF EMBODIMENTS

The following illustrates embodiments of the present disclosure by particular specific embodiments, and other advantages and effects of the present disclosure can be readily understood by a person skilled in the art from the contents disclosed in this specification. The present disclosure can also be embodied or applied by other different specific embodiments, and various details in this specification can also be modified or changed in various ways based on different viewpoints and applications without departing from the spirit of the present disclosure.

It should be noted that the illustrations provided in this embodiment (referring to FIG. 1 to FIG. 11) are only schematic to illustrate the basic concept of the present disclosure, thus only components related to the present disclosure are shown in the illustrations and are not drawn in accordance with the number, shape and size of components in actual embodiments, shape, number and proportion of each component may be an arbitrary change, and the layout of components may be more complex.

Embodiment 1

Figure 1:
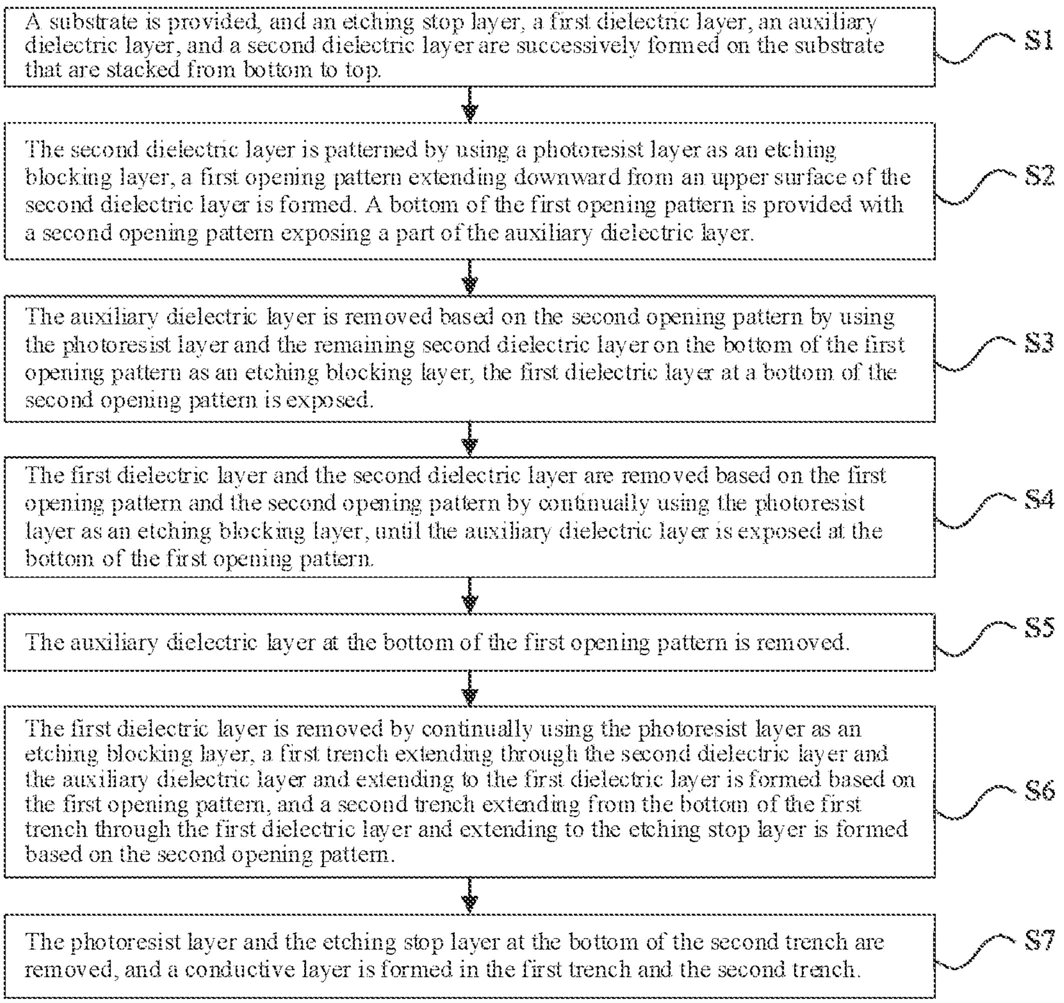
FIG. 1 shows a process flow chart of a method for manufacturing a semiconductor device of the present disclosure.

This embodiment provides a method for manufacturing a semiconductor device, referring to FIG. 1, which shows a process flow chart of the method, the method includes the following steps:

S1: a substrate is provided, and an etching stop layer, a first dielectric layer, an auxiliary dielectric layer, and a second dielectric layer are successively formed on the substrate that are stacked from bottom to top.

S2: the second dielectric layer is patterned by using a photoresist layer as an etching blocking layer, a first opening pattern extending downward from an upper surface of the second dielectric layer is formed. A bottom of the first opening pattern is provided with a second opening pattern exposing a part of the auxiliary dielectric layer.

S3: the auxiliary dielectric layer is removed based on the second opening pattern by using the photoresist layer and the remaining second dielectric layer on the bottom of the first opening pattern as an etching blocking layer, the first dielectric layer at a bottom of the second opening pattern is exposed.

S4: the first dielectric layer and the second dielectric layer are removed based on the first opening pattern and the second opening pattern by continually using the photoresist layer as an etching blocking layer, until the auxiliary dielectric layer is exposed at the bottom of the first opening pattern.

S5: the auxiliary dielectric layer at the bottom of the first opening pattern is removed.

S6: the first dielectric layer is removed by continually using the photoresist layer as an etching blocking layer, a first trench extending through the second dielectric layer and the auxiliary dielectric layer and extending to the first dielectric layer is formed based on the first opening pattern, and a second trench extending from the bottom of the first trench through the first dielectric layer and extending to the etching stop layer is formed based on the second opening pattern.

S7: the photoresist layer and the etching stop layer at the bottom of the second trench are removed, and a conductive layer is formed in the first trench and the second trench.

Figure 2:
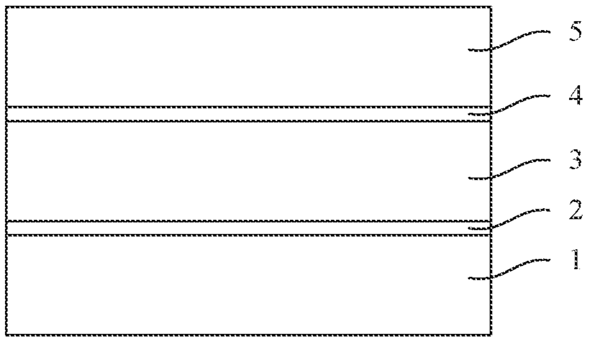
FIG. 2 shows a schematic view of a device obtained after the step of forming an etching stop layer, a first dielectric layer, an auxiliary dielectric layer, and a second dielectric layer that are successively stacked from bottom to top on the substrate in the method for manufacturing the semiconductor device of the present disclosure.

Firstly, referring to FIG. 2, step S1 is performed: the substrate 1 is provided, and the etching stop layer 2, the first dielectric layer 3, the auxiliary dielectric layer 4, and the second dielectric layer 5 are successively formed on the substrate 1 that are stacked from bottom to top.

As an example, the substrate 1 includes but not limited to one of silicon substrate, germanium substrate, germanium-silicon substrate, silicon carbide substrate, group III-V compound substrate. The substrate 1 may be provided with an anterior layer structure, such as shallow trench isolation structure, polycrystalline silicon layer, conductive metal layer, interlayer dielectric layer, and other structures. A material of the auxiliary dielectric layer 4 is different from materials of the first dielectric layer 3 and the second dielectric layer 5.

As an example, a material of the etching stop layer 2 includes one of silicon nitride and silicon oxynitride. The first dielectric layer 3 includes one or more of boro-phospho-silicate glass layer, phospho-silicate glass layer, fluoro-silicate glass layer, undoped silicate glass layer, tetraethyl orthosilicate layer, thermally oxidized silicon dioxide layer, and wet oxidized silicon dioxide layer. A material of the auxiliary dielectric layer 4 includes silicon carbide. The second dielectric layer 5 includes one or more of boro-phospho-silicate glass layer, phospho-silicate glass layer, fluoro-silicate glass layer, undoped silicate glass layer, tetraethyl orthosilicate layer, thermally oxidized silicon dioxide layer, and wet oxidized silicon dioxide layer.

It should be noted that the etching stop layer 2, the first dielectric layer 3, the auxiliary dielectric layer 4, and the second dielectric layer 5 can also be selected as other suitable materials, as long as the etching stop layer 2 and the first dielectric layer 3 have a large etching selectivity ratio under specific etching conditions, the first dielectric layer 3 and the auxiliary dielectric layer 4 have a large etching selectivity ratio under specific etching conditions, and the auxiliary dielectric layer 4 and the second dielectric layer 5 have a large etching selectivity ratio under specific etching conditions, the scope of protection of the present disclosure shall not be unduly limited herein.

Figure 3:
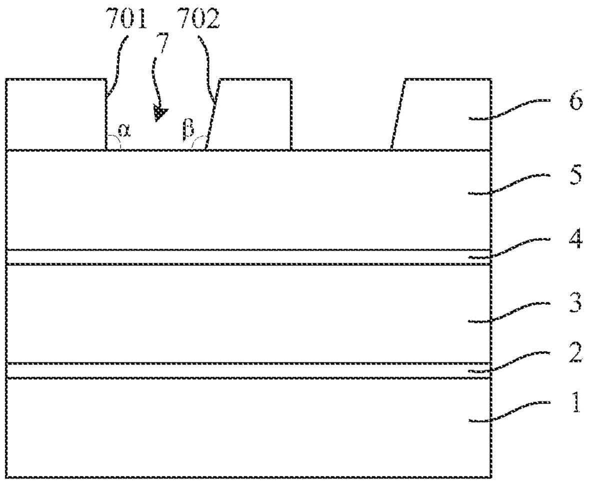
FIG. 3 shows a schematic view of a device obtained after the step of forming a photoresist layer on the second dielectric layer, and forming a photoresist opening pattern in the photoresist layer based on a photolithographic mask having an opening pattern in the method for manufacturing the semiconductor device of the present disclosure.
Figure 4:
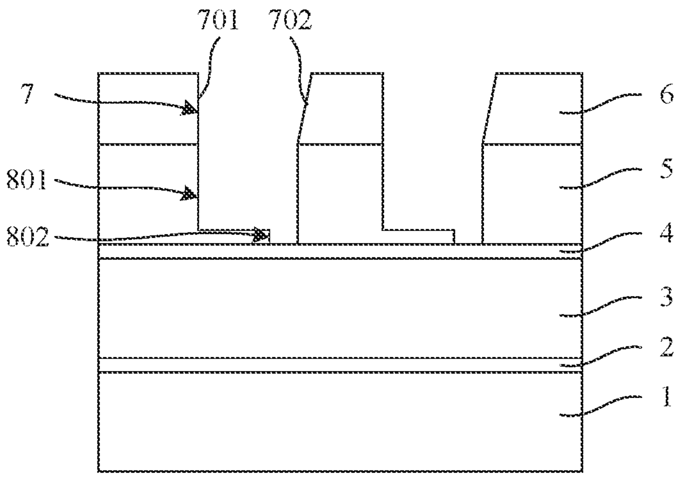
FIG. 4 shows a schematic view of a device obtained after the step of patterning the second dielectric layer by using a photoresist layer as an etching blocking layer in the method for manufacturing the semiconductor device of the present disclosure.

Moreover, referring to FIG. 3 and FIG. 4, step S2 is performed: the second dielectric layer 5 is patterned by using the photoresist layer 6 as the etching blocking layer, the first opening pattern 801 extending downward from the upper surface of the second dielectric layer 5 is formed. The bottom of the first opening pattern 801 is provided with the second opening pattern 802 exposing the part of the auxiliary dielectric layer 4.

Specifically, in this embodiment, the second opening pattern 802 exposing the part of the auxiliary dielectric layer 4 is subsequently formed at the bottom of the first opening pattern 801 by controlling an inclination of a sidewall of the photoresist opening pattern 7.

Specifically, as shown in FIG. 3, the photoresist layer 6 is formed on the second dielectric layer 5 using spin-coating or other suitable methods, and the photoresist layer 6 is exposed based on a photolithographic mask with an opening pattern, which is then developed and the photoresist opening pattern 7 in the photoresist layer 6 is obtained. The photoresist opening pattern 7 includes a first sidewall 701 and a second sidewall 702 asymmetric to the first sidewall. An angle α between the first sidewall 701 and a bottom surface of the photoresist opening is different from an angle β between the second sidewall 702 and the bottom surface of the photoresist opening.

Specifically, the asymmetric photoresist opening pattern 7 is obtained utilizing a phase difference inherent in photolithography machine, such that the angle α between the first sidewall 701 and the bottom surface of the photoresist opening is not equal to the angle β between the second sidewall 702 and the bottom surface of the photoresist opening. For example, when the angle α between the first sidewall 701 and the bottom surface of the photoresist opening is 90°, the angle β between the second sidewall 702 and the bottom surface of the photoresist opening is greater than 90°. Of course, both a and B can also be obtuse angles.

Specifically, as shown in FIG. 4, the second dielectric layer 5 is patterned by using dry etching with anisotropy, the first opening pattern 801 extending downward from the upper surface of the second dielectric layer 5 is formed. The second opening pattern 802 exposing the part of the auxiliary dielectric layer 4 is provided at the bottom of the first opening pattern 801. The second opening pattern 802 is formed at an edge position at the bottom of the first opening pattern 801. In other words, one sidewall of the second opening pattern 802 is connected to a sidewall of the first opening pattern 801, and the other sidewall of the second opening pattern 802 is spaced apart from the sidewall of the first opening pattern 801.

In this embodiment, the angle α between the first sidewall 701 and the bottom surface of the photoresist opening is small, and an etching rate of the material close to the first sidewall 701 is slow, while the angle β between the second sidewall 702 and the bottom surface of the photoresist opening is large, and an etching rate of the material close to the second sidewall 702 is fast, such that a stepped opening pattern consisting of the first opening pattern 801 and the second opening pattern 802 is obtained.

In this embodiment, for the second dielectric layer 5 with silicon oxide material, the second dielectric layer 5 is patterned by dry etching, and an employed etching gas includes a gas combination of $CF_4/C_4F_8/Ar/O_2$. A flow adjustment range of $CF_4$ is 10 to 30 sccm, a flow adjustment range of $O_2$ is 10 to 20 sccm, a flow adjustment range of $C_4F_8$ is 10 to 30 sccm, a flow adjustment range of Ar is 100 to 200 sccm, a process pressure adjustment range is 50 to 70 mT, and a downstream radio frequency source power adjustment range is 700 to 900 W. An etching rate of the gas combination of $CF_4/C_4F_8/Ar/O_2$ to the second dielectric layer 5 is much higher than an etching rate of the gas combination to the auxiliary dielectric layer 4, resulting in little loss or no loss of the auxiliary dielectric layer 4.

Figure 5:
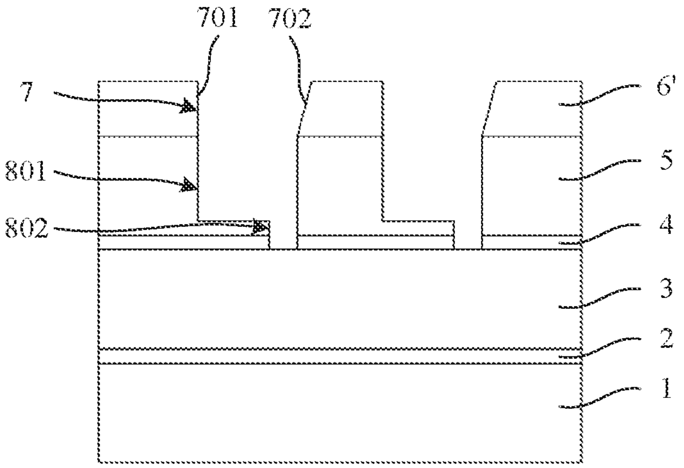
FIG. 5 shows a schematic view of a device obtained after the step of removing the auxiliary dielectric layer based on the second opening pattern by using the photoresist layer and the remaining second dielectric layer on the bottom of the first opening pattern as an etching blocking layer in the method for manufacturing the semiconductor device of the present disclosure.

Referring to FIG. 5, step S3 is performed: the auxiliary dielectric layer 4 is removed based on the second opening pattern 802 by using the photoresist layer 6 and the remaining second dielectric layer 5 on the bottom of the first opening pattern 801 as the etching blocking layer, and the first dielectric layer 3 at the bottom of the second opening pattern 802 is exposed.

In this embodiment, for the auxiliary dielectric layer 4 with silicon carbide material, the auxiliary dielectric layer 4 is dry etched, and the employed etching gas includes a gas combination of $SF_6/O_2$. An etching rate of the gas combination to the auxiliary dielectric layer 4 is much higher than an etching rate of the gas combination to the second dielectric layer 5 and the first dielectric layer 3, resulting in little loss or no loss of the second dielectric layer 5 and the first dielectric layer 3. Therefore, when the auxiliary dielectric layer 4 exposed by the second opening pattern 802 is completely dry etched, there is still a remaining second dielectric layer 5 at the bottom of the first opening pattern 801. And in this step, the photoresist layer 6 is also partially removed in thickness, thus obtaining a photoresist layer 6'.

Figure 6:
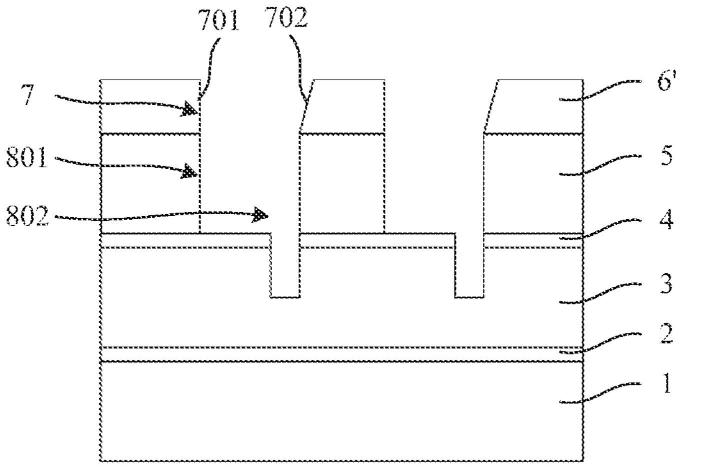
FIG. 6 shows a schematic view of a device obtained after the step of removing the first dielectric layer and the second dielectric layer based on the first opening pattern and the second opening pattern by continually using the photoresist layer as an etching blocking layer, until the auxiliary dielectric layer is exposed at the bottom of the first opening pattern in the method for manufacturing the semiconductor device of the present disclosure.

Referring to FIG. 6, step S4 is performed: the first dielectric layer 3 and the second dielectric layer 5 are removed based on the first opening pattern 801 and the second opening pattern 802 by continually using the photoresist layer 6" as the etching blocking layer, until the auxiliary dielectric layer 4 is exposed at the bottom of the first opening pattern 801.

In this embodiment, for the second dielectric layer 5 and the first dielectric layer 3 with silicon oxide material, the second dielectric layer 5 and the first dielectric layer 3 are dry etched, and the employed etching gas includes $CF_4/CHF_3/Ar$, $CF_4/CHF_3/Ar/O_2$, $C_4F_8/O_2/Ar$, $C_4F_8/O_2/CO/Ar$, $C_4F_6/O_2/Ar$, $C_4F_6/O_2/CO/Ar$, $C_5F_8/O_2/Ar$, $C_5F_8/O_2/CO/Ar$ or other suitable gas combinations. An etching rate of the gas combination to the first dielectric layer 3 and the second dielectric layer 5 is much higher than an etching rate of the gas combination to the auxiliary dielectric layer 4, resulting in little loss or no loss of the auxiliary dielectric layer 4.

Figure 7:
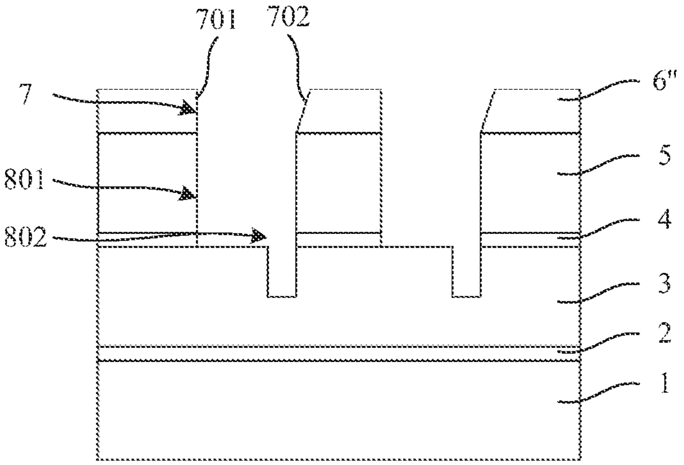
FIG. 7 shows a schematic view of a device obtained after the step of removing the auxiliary dielectric layer at the bottom of the first opening pattern in the method for manufacturing the semiconductor device of the present disclosure.

Referring to FIG. 7, step S5 is performed: the auxiliary dielectric layer 4 at the bottom of the first opening pattern 801 is removed until the first dielectric layer 3 is exposed.

In this embodiment, for the auxiliary dielectric layer 4 with silicon carbide material, the auxiliary dielectric layer 4 is dry etched, and the employed etching gas includes a gas combination of $SF_6/O_2$. An etching rate of the gas combination to the auxiliary dielectric layer 4 is much higher than an etching rate of the gas combination to the first dielectric layer 3, resulting in little loss or no loss of the first dielectric layer 3. In this step, the photoresist layer 6' is also partially removed in thickness, thus obtaining a photoresist layer 6".

Figure 8:
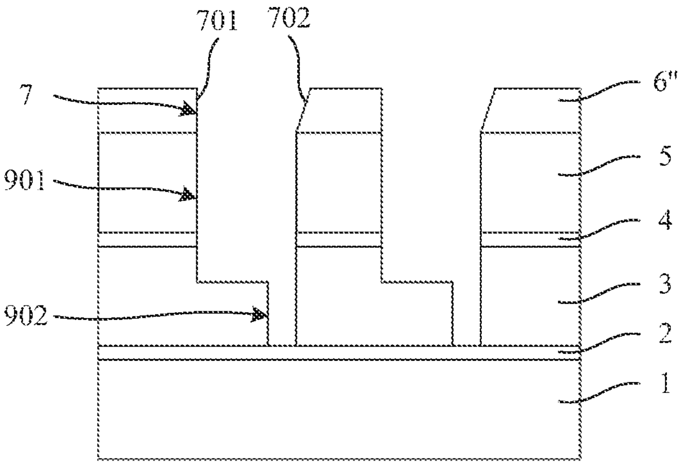
FIG. 8 shows a schematic view of a device obtained after the step of removing the first dielectric layer by continually using the photoresist layer as an etching blocking layer, forming, based on the first opening pattern, a first trench extending through the second dielectric layer and the auxiliary dielectric layer and extending to the first dielectric layer, and forming, based on the second opening pattern, a second trench extending from the bottom of the first trench through the first dielectric layer and extending to the etching stop layer in the method for manufacturing the semiconductor device of the present disclosure.

Referring to FIG. 8, step S6 is performed: the first dielectric layer 3 is removed by continually using the photoresist layer 6" as the etching blocking layer, a first trench 901 extending through the second dielectric layer 5 and the auxiliary dielectric layer 4 and extending to the first dielectric layer 3 is formed based on the first opening pattern 801, and a second trench 902 extending from the bottom of the first trench 901 through the first dielectric layer 3 and extending to the etching stop layer 2 is formed based on the second opening pattern 802.

In this embodiment, for the first dielectric layer 3 with silicon oxide material, the first dielectric layer 3 is dry etched, and the employed etching gas includes $CF_4/CHF_3/Ar$, $CF_4/CHF_3/Ar/O_2$, $C_4F_8/O_2/Ar$, $C_4F_8/O_2/CO/Ar$, $C_4F_6/O_2/Ar$, $C_4F_6/O_2/CO/Ar$, $C_5F_8/O_2/Ar$, $C_5F_8/O_2/CO/Ar$ or other suitable gas combinations. An etching rate of the gas combination to the first dielectric layer 3 is much higher than an etching rate of the gas combination to the etching stop layer 2, resulting in little loss or no loss of the etching stop layer 2.

Figure 9:
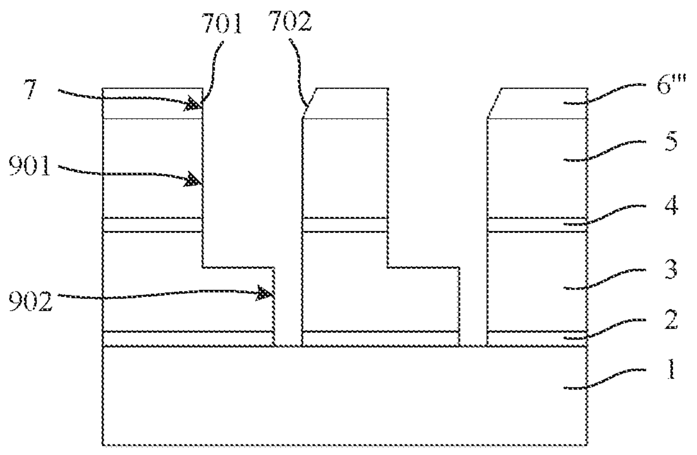
FIG. 9 shows a schematic view of a device obtained after the step of removing the etching stop layer at the bottom of the second trench in the method for manufacturing the semiconductor device of the present disclosure.
Figure 10:
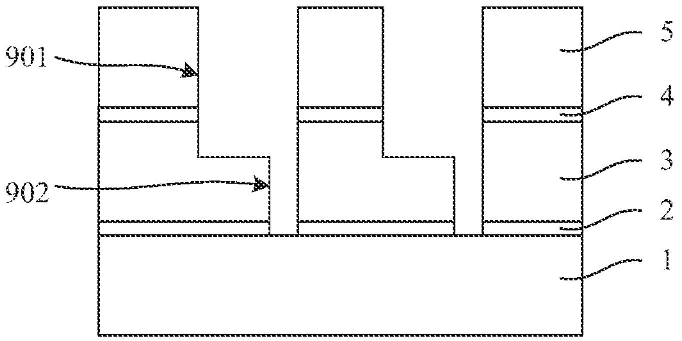
FIG. 10 shows a schematic view of a device obtained after the step of removing the photoresist layer in the method for manufacturing the semiconductor device of the present disclosure.
Figure 11:
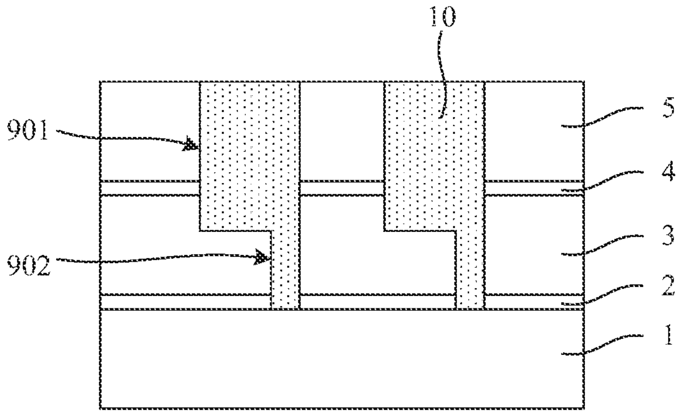
FIG. 11 shows a schematic view of a device obtained after the step of forming a conductive layer in the first trench and the second trench in the method for manufacturing the semiconductor device of the present disclosure.

Referring to FIG. 9 to FIG. 11, step S7 is performed: the photoresist layer 6" and the etching stop layer 2 at the bottom of the second trench 902 are removed, and the conductive layer 10 is formed in the first trench 901 and the second trench 902.

Specifically, as shown in FIG. 9, firstly the etching stop layer 2 at the bottom of the second trench 902 is removed, and meanwhile the photoresist layer 6" is also partially removed in thickness, thus obtaining a photoresist layer 6".

In this embodiment, for the etching stop layer 2 with silicon nitride material, the etching stop layer 2 is dry etched, and the employed etching gas includes $CHF_3/Ar/O_2$, $CH_2F_2/Ar/O_2$, $CH_3F/Ar/O_2$ or other suitable gas combinations. An etching rate of the gas combination to the etching stop layer 2 is much higher than an etching rate of the gas combination to the first dielectric layer 3, therefore when the etching stop layer 2 at the bottom of the second trench 902 is completely removed, the bottom surface of the first trench 901 still remains in the first dielectric layer 3, and meanwhile the photoresist layer 6" is also partially removed in thickness, thus obtaining a photoresist layer 6".

Specifically, the etching stop layer 2 at the bottom of the second trench 902 is firstly removed, the photoresist layer 6" is then removed, and a structure as shown in FIG. 10 is obtained.

Specifically, as shown in FIG. 11, the conductive layer 10 is deposited in the first trench 901, in the second trench 902 and on the second dielectric layer 5, and the conductive layer 10 is flattened until a top surface of the conductive layer 10 is coplanar with a top surface of the second dielectric layer 5 using chemical mechanical polishing or other suitable methods. A material of the conductive layer includes at least one of Cu, W, Al, Ag and Au, or other suitable conductive materials.

Accordingly, a semiconductor device is obtained. The method for manufacturing the semiconductor device of this embodiment forms an asymmetric photoresist opening morphology by utilizing the phase difference inherent in photolithography machine, then etches a stepped opening with asymmetric left and right depths in the dielectric layer combined with subsequent preset etching steps, and forms a conductive layer in the stepped opening, thereby a dual damascene-like damascene structure is obtained. The method for manufacturing the semiconductor device of this embodiment achieves the manufacturing of the dual damascene-like damascene structure by only one coating development, which not only simplifies the process flow, but also reduces the production cost. The support of expensive lithography apparatus is not required, and the apparatus cost is lower. In addition, the method for manufacturing the semiconductor device of this embodiment has wide applicability and can be compatible with current CMOS/DMOS/BCD processes, and has a broader application prospect.

Embodiment 2

This embodiment provides a semiconductor device, referring to FIG. 11, which shows a schematic view of the semiconductor device. The semiconductor device includes a dielectric layer, and a first trench 901 and a second trench 902 located in the dielectric layer. The first trench 901 extends downward from an upper surface of the dielectric layer, and a trench depth of the first trench 901 is less than a thickness of the dielectric layer. The second trench 902 extends downward from the bottom surface of the first trench 901 and extends the dielectric layer, and the first trench 901 and the second trench 902 are provided with a conductive layer 10 therein. The semiconductor device is manufactured using the method for manufacturing the semiconductor device described in Embodiment 1. The dielectric layer includes an etching stop layer 2, a first dielectric layer 3, an auxiliary dielectric layer 4, and a second dielectric layer 5. A bottom of the first trench 901 can be located in the first dielectric layer 3, and the second trench 902 extends through parts of the first dielectric layer 3 and the etching stop layer 2.

Specifically, the second trench 902 is located at an edge of the first trench 901, i.e., one sidewall of the second trench 902 is connected to a sidewall of the first trench 901, and the other sidewall of the second trench 902 is spaced apart from the sidewall of the first trench 901.

As an example, a trench depth of the first trench 901 is greater than a trench depth of the second trench 902. The trench depth of the first trench 901 is a distance from a trench opening of the first trench 901 to a trench bottom of the first trench 901, and the trench depth of the second trench 902 is a distance from the trench bottom of the first trench 901 to a trench bottom of the second trench 902.

As an example, the conductive layer 10 can serve as a conductive interconnection layer of a semiconductor device. A material of the conductive layer 10 includes at least one of Cu, W, Al, Ag and Au. A critical dimension of a part of the conductive layer 10 located in the first trench 901 is larger than a critical dimension of a part the conductive layer 10 located in the second trench 902. The substrate 1 is exposed by the bottom of the second trench 902. The part of the conductive layer 10 located in the first trench 901 may serve as a conductive wire layer of the conductive interconnection layer, and the part of the conductive layer 10 located in the second trench 902 may serve as a via layer of the conductive interconnection layer.

In summary, the semiconductor device of the present disclosure and the manufacturing method therefor form an asymmetric photoresist opening morphology by utilizing the phase difference inherent in photolithography machine, then etch a stepped opening with asymmetric left and right depths in the dielectric layer combined with subsequent preset etching menu. Based on the depth difference between left and right, and through reasonable matching of the dielectric film layer, the present disclosure achieves a manufacturing of the dual damascene-like damascene structure by only one coating development, which not only simplifies the process flow, but also reduces the production cost. The support of expensive lithography apparatus is not required, and the apparatus cost is lower. The present disclosure has wide applicability and can be compatible with current CMOS/DMOS/BCD processes, and has a broader application prospect. Accordingly, the present disclosure effectively overcomes the drawbacks of the prior art and has high industrial utilization value.

The above embodiments are only exemplary illustrations of the principles and effects of the present disclosure, and are not intended to limit the present disclosure. Any person skilled in the art can modify or change the above embodiments without departing from the spirit and scope of the present disclosure. Therefore, all equivalent modifications or variations made by a person of ordinary skill in the art without departing from the spirit and technical ideas disclosed in the present disclosure shall still be covered by the claims of the present disclosure.

What is claimed is:

1. A method for manufacturing a semiconductor device, comprising the following steps:

providing a substrate, and forming an etching stop layer, a first dielectric layer, an auxiliary dielectric layer, and a second dielectric layer that are successively stacked from bottom to top on the substrate;

patterning the second dielectric layer by using a photoresist layer as an etching blocking layer, forming a first opening pattern extending downward from an upper surface of the second dielectric layer, wherein a bottom of the first opening pattern is provided with a second opening pattern exposing a part of the auxiliary dielectric layer;

removing the auxiliary dielectric layer based on the second opening pattern by using the photoresist layer and the remaining second dielectric layer on the bottom of the first opening pattern as an etching blocking layer, and exposing the first dielectric layer at a bottom of the second opening pattern;

removing the first dielectric layer and the second dielectric layer based on the first opening pattern and the second opening pattern by continually using the photoresist layer as an etching blocking layer, until the auxiliary dielectric layer is exposed at the bottom of the first opening pattern;

removing the auxiliary dielectric layer at the bottom of the first opening pattern; and removing the first dielectric layer by continually using the photoresist layer as an etching blocking layer, forming, based on the first opening pattern, a first trench extending through the second dielectric layer and the auxiliary dielectric layer and extending to the first dielectric layer, and forming, based on the second opening pattern, a second trench extending from the bottom of the first trench through the first dielectric layer and extending to the etching stop layer; and removing the photoresist layer and the etching stop layer at the bottom of the second trench, and forming a conductive layer in the first trench and the second trench.

2. The method for manufacturing the semiconductor device according to claim 1, wherein the patterning the second dielectric layer by using the photoresist layer as the etching blocking layer, forming the first opening pattern extending downward from the upper surface of the second dielectric layer, wherein the bottom of the first opening pattern is provided with the second opening pattern exposing the part of the auxiliary dielectric layer further comprises:

providing a photoresist opening pattern on the photoresist layer, and forming a second opening pattern exposing the part of the auxiliary dielectric layer at the bottom of the first opening pattern by controlling an inclination of a sidewall of the photoresist opening pattern.

3. The method for manufacturing the semiconductor device according to claim 1, wherein the patterning the second dielectric layer by using the photoresist layer as the etching blocking layer, forming the first opening pattern extending downward from the upper surface of the second dielectric layer, wherein the bottom of the first opening pattern is provided with the second opening pattern exposing the part of the auxiliary dielectric layer further comprises:

preparing a photoresist opening pattern in the photoresist layer by utilizing a phase difference inherent in photolithography machine, wherein the photoresist opening pattern comprises a first sidewall and a second sidewall asymmetric to the first sidewall, and an angle between the first sidewall and a bottom surface of the photoresist opening pattern is different from an angle between the second sidewall and the bottom surface of the photoresist opening pattern.

4. The method for manufacturing the semiconductor device according to claim 3, wherein the angle between the first sidewall and the bottom surface of the photoresist opening pattern is less than the angle between the second sidewall and the bottom surface of the photoresist opening pattern.

5. The method for manufacturing the semiconductor device according to claim 1, wherein the first dielectric layer comprises one or more of boro-phospho-silicate glass layer, phospho-silicate glass layer, fluoro-silicate glass layer, undoped silicate glass layer, tetraethyl orthosilicate layer, thermally oxidized silicon dioxide layer, and wet oxidized silicon dioxide layer; a material of the auxiliary dielectric layer comprises silicon carbide; the second dielectric layer comprises one or more of boro-phospho-silicate glass layer, phospho-silicate glass layer, fluoro-silicate glass layer, undoped silicate glass layer, tetraethyl orthosilicate layer, thermally oxidized silicon dioxide layer, and wet oxidized silicon dioxide layer; and a material of the etching stop layer comprises one of silicon nitride and silicon oxynitride.

6. The method for manufacturing the semiconductor device according to claim 1, wherein the removing the auxiliary dielectric layer based on the second opening pattern by using the photoresist layer and the remaining second dielectric layer on the bottom of the first opening pattern as the etching blocking layer, and exposing the first dielectric layer at the bottom of the second opening pattern further comprises:

removing the auxiliary dielectric layer by dry etching, wherein an etching rate of an employed dry etching gas to the auxiliary dielectric layer is greater than an etching rate of the dry etching gas to the second dielectric layer, and when the auxiliary dielectric layer exposed by the second opening pattern is completely dry etched, there is still a remaining second dielectric layer at the bottom of the first opening pattern.

7. The method for manufacturing the semiconductor device according to claim 6, wherein the dry etching gas at least comprises $SF_6$ and $O_2$.

8. The manufacturing method of semiconductor device according to claim 1, wherein the removing the first dielectric layer and the second dielectric layer based on the first opening pattern and the second opening pattern by continually using the photoresist layer as the etching blocking layer, until the auxiliary dielectric layer is exposed at the bottom of the first opening pattern further comprises:

removing the first dielectric layer and the second dielectric layer by dry etching, wherein an etching rate of an employed dry etching gas to the first dielectric layer and the second dielectric layer is greater than an etching rate of the dry etching gas to the auxiliary dielectric layer, and a removal thickness of the first dielectric layer based on the second opening pattern is less than a thickness of the first dielectric layer.

9. The method for manufacturing the semiconductor device according to claim 8, wherein the dry etching gas comprises one or more of gas combination of $CF_4/CHF_3/Ar$, $CF_4/CHF_3/Ar/O_2$, $C_4F_8/O_2/Ar$, $C_4F_8/O_2/CO/Ar$, $C_4F_6/O_2/Ar$, $C_4F_6/O_2/CO/Ar$, $C_5F_8/O_2/Ar$ and $C_5F_8/O_2/CO/Ar$.

10. The method for manufacturing the semiconductor device according to claim 1, wherein removing the photoresist layer and the etching stop layer at the bottom of the second trench, and forming the conductive layer in the first trench and the second trench further comprises:

firstly removing the etching stop layer at the bottom of the second trench, then removing the photoresist layer, depositing the conductive layer in the first trench, in the second trench and on the second dielectric layer, and enabling a top surface of the conductive layer to be coplanar with a top surface of the second dielectric layer.

* * * * *